(12) United States Patent
Klein et al.

(10) Patent No.: US 7,388,294 B2
(45) Date of Patent: Jun. 17, 2008

(54) SEMICONDUCTOR COMPONENTS HAVING STACKED DICE

(75) Inventors: Dean A. Klein, Eagle, ID (US); Alan G. Wood, Boise, ID (US); Trung Tri Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 10/351,888

(22) Filed: Jan. 27, 2003

(65) Prior Publication Data

US 2004/0145051 A1    Jul. 29, 2004

(51) Int. Cl.
*H01L 23/48* (2006.01)
*H01L 23/52* (2006.01)
*H01L 29/40* (2006.01)

(52) U.S. Cl. ............... 257/778; 257/686; 257/E21.503; 257/E25.006

(58) Field of Classification Search ................ 257/778, 257/685–686, 723, 777, 737, 738, 787, 790, 257/792, 730, 773, 786, E21.503, E25.006, 257/E25.013, E25.021, E25.027, E23.085, 257/E21.614, E23.021, E21.508, E31.117, 257/E51.02, E23.116, E23.133, E23.134
See application file for complete search history.

(56) References Cited

U.S. PATENT DOCUMENTS

| 5,138,434 A | 8/1992 | Wood et al. |
| 5,299,092 A | 3/1994 | Yaguchi et al. |
| 5,437,915 A | 8/1995 | Nishimura et al. |
| 5,495,667 A | 3/1996 | Farnworth et al. |
| 5,543,658 A | 8/1996 | Hosokawa et al. |
| 5,686,317 A | 11/1997 | Akram et al. |

(Continued)

FOREIGN PATENT DOCUMENTS

JP    4-320362    11/1992

(Continued)

OTHER PUBLICATIONS

Dexter Electronic Materials, Hysol® FP4450 Material Properties, spec sheet, pp. 1-2, Aug. 20, 1999.

(Continued)

*Primary Examiner*—Theresa T. Doan
*Assistant Examiner*—Dilinh Nguyen
(74) *Attorney, Agent, or Firm*—Stephen A. Gratton

(57) ABSTRACT

A semiconductor package component includes a base die and a secondary die flip chip mounted to the base die. The base die includes a set of stacking contacts for flip chip mounting the secondary die to the base die, and a set of interconnect contacts configured as an internal signal transmission system, and a physical structure for supporting a terminal contact system of the package component. The package component also includes an encapsulant on the base die encapsulating the interconnect contacts, an underfill layer between the dice, and terminal contacts configured for flip chip mounting the package component to a supporting substrate. A method for fabricating the package component includes the steps of providing a base wafer containing a plurality of base dice, and flip chip mounting the secondary dice to the base dice on the base wafer. In addition the method includes the steps of forming and planarizing the interconnect contacts on the base dice, and forming the terminal contacts on the planarized interconnect contacts.

38 Claims, 11 Drawing Sheets

U.S. PATENT DOCUMENTS

| | | | |
|---|---|---|---|
| 5,851,911 A | 12/1998 | Farnworth | |
| 5,869,894 A * | 2/1999 | Degani et al. | 257/723 |
| 5,888,883 A | 3/1999 | Sasaki et al. | |
| 5,895,581 A * | 4/1999 | Grunwald | 216/13 |
| 5,897,337 A | 4/1999 | Kata et al. | |
| 6,060,373 A | 5/2000 | Saitoh | |
| 6,080,602 A | 6/2000 | Tani et al. | |
| 6,087,845 A | 7/2000 | Wood et al. | |
| 6,097,087 A | 8/2000 | Farnworth et al. | |
| 6,118,179 A | 9/2000 | Farnworth et al. | |
| 6,130,111 A | 10/2000 | Ikuina et al. | |
| 6,153,448 A | 11/2000 | Takahashi et al. | |
| 6,169,329 B1 | 1/2001 | Farnworth et al. | |
| 6,177,295 B1 | 1/2001 | De Samber et al. | |
| 6,201,266 B1 * | 3/2001 | Ohuchi et al. | 257/106 |
| 6,204,562 B1 * | 3/2001 | Ho et al. | 257/777 |
| 6,221,751 B1 | 4/2001 | Chen et al. | |
| 6,233,185 B1 | 5/2001 | Beffa et al. | |
| 6,235,554 B1 | 5/2001 | Akram et al. | |
| 6,249,372 B1 | 6/2001 | Kobayashi et al. | |
| 6,252,299 B1 | 6/2001 | Masuda et al. | |
| 6,271,056 B1 | 8/2001 | Farnworth et al. | |
| 6,281,131 B1 | 8/2001 | Gilton et al. | |
| 6,301,121 B1 | 10/2001 | Lin | |
| 6,303,981 B1 | 10/2001 | Moden | |
| 6,310,390 B1 | 10/2001 | Moden | |
| 6,313,531 B1 | 11/2001 | Geusic et al. | |
| 6,326,698 B1 | 12/2001 | Akram | |
| 6,330,158 B1 | 12/2001 | Akram | |
| 6,338,980 B1 | 1/2002 | Satoh | |
| 6,352,242 B1 | 3/2002 | Medearis | |
| 6,368,896 B2 | 4/2002 | Farnworth et al. | |
| 6,368,930 B1 | 4/2002 | Enquist | |
| 6,369,448 B1 | 4/2002 | McCormick | |
| 6,384,487 B1 | 5/2002 | Smith | |
| 6,440,772 B1 | 8/2002 | Smith | |
| 6,441,483 B1 | 8/2002 | Akram | |
| 6,465,877 B1 | 10/2002 | Farnworth et al. | |
| 6,482,674 B1 | 11/2002 | Kinsman | |
| 6,501,165 B1 | 12/2002 | Farnworth et al. | |
| 6,506,625 B1 | 1/2003 | Moden | |
| 6,507,114 B2 | 1/2003 | Hui et al. | |
| 6,582,992 B2 | 6/2003 | Poo et al. | |
| 6,611,052 B2 | 8/2003 | Poo et al. | |
| 6,614,104 B2 | 9/2003 | Farnworth et al. | |
| 6,765,299 B2 * | 7/2004 | Takahashi et al. | 257/777 |
| 6,768,190 B2 * | 7/2004 | Yang et al. | 257/686 |
| 6,784,530 B2 * | 8/2004 | Sugaya et al. | 257/686 |
| 6,833,613 B1 | 12/2004 | Akram et al. | |
| 6,841,883 B1 | 1/2005 | Farnworth et al. | |
| 6,853,064 B2 | 2/2005 | Bolken et al. | |
| 6,897,089 B1 | 5/2005 | Farnworth | |
| 6,906,418 B2 | 6/2005 | Hiatt et al. | |
| 6,908,784 B1 | 6/2005 | Farnworth et al. | |
| 6,949,834 B2 | 9/2005 | Connell et al. | |
| 2002/0074637 A1 | 6/2002 | McFarland | |
| 2003/0111709 A1 * | 6/2003 | Lin et al. | 257/532 |
| 2004/0036157 A1 * | 2/2004 | Akram et al. | 257/690 |

FOREIGN PATENT DOCUMENTS

| | | |
|---|---|---|
| JP | 4-320365 | 11/1992 |
| JP | 5-67726 | 3/1993 |
| JP | 405082720 A | 4/1993 |
| JP | 10-79362 | 3/1998 |
| JP | 2000-31185 | 1/2000 |

OTHER PUBLICATIONS

Dexter Electronic material, Hysol® FP4451 Material Properties, spec sheet, pp. 1-2, Aug. 20, 1999.

Wafer Size CSP Packaging by VPES, Japan Rec Co., Ltd., advertising material, pp. 1-4, 1998.

Parylene Coating, advertising for Specialty Coating Systems, pp. 1-2, date unknown.

Advanced Coating Parylene Conformal Coating Specialists, advertising material, p. 107, 1998, month unknown.

David Francis and Linda Jardine, "Thin, Wafer-Level Package Is made Without Damaging Die", Chip Scale Review, May/Jun. 2002, p. 70.

Jeffrey C. Demmin, "More Wafer Thinning at ICAPS", *Advanced Packaging*, Mar. 13, 2002.

U.S. Appl. No. 09/640,801, filed Feb. 26, 1999.
U.S. Appl. No. 09/652,340, filed Aug. 31, 2000.
U.S. Appl. No. 10/094,161, filed Mar. 6, 2002.

* cited by examiner

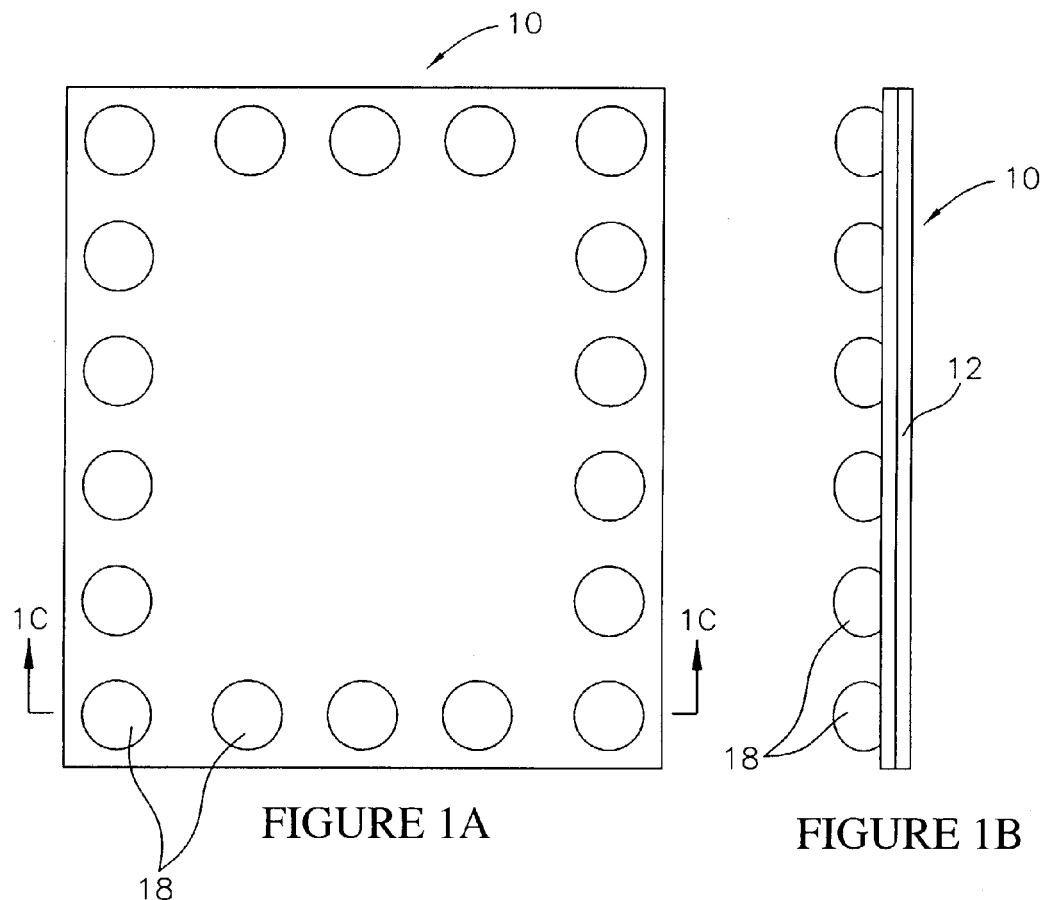
FIGURE 1A
FIGURE 1B
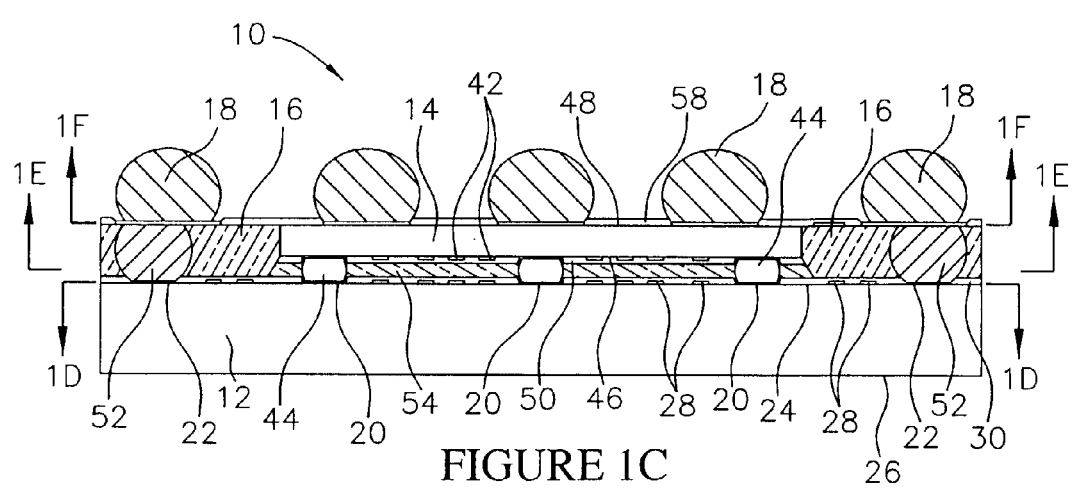
FIGURE 1C

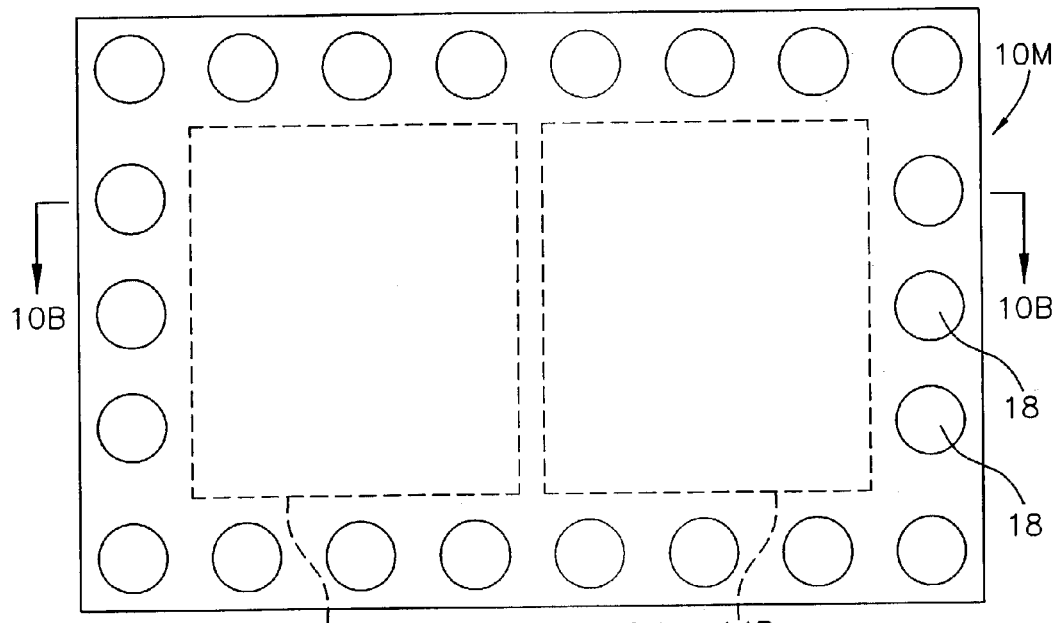
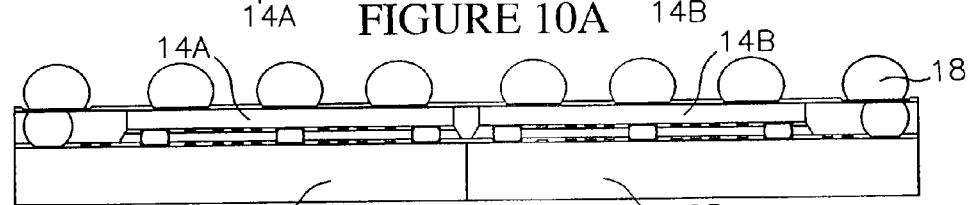
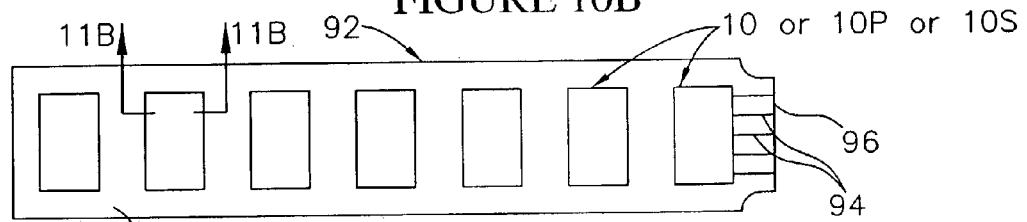
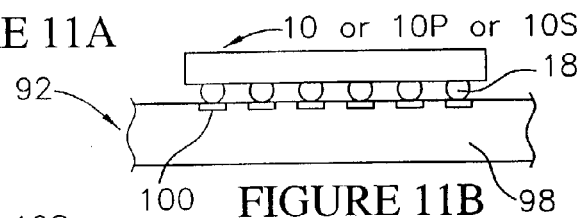
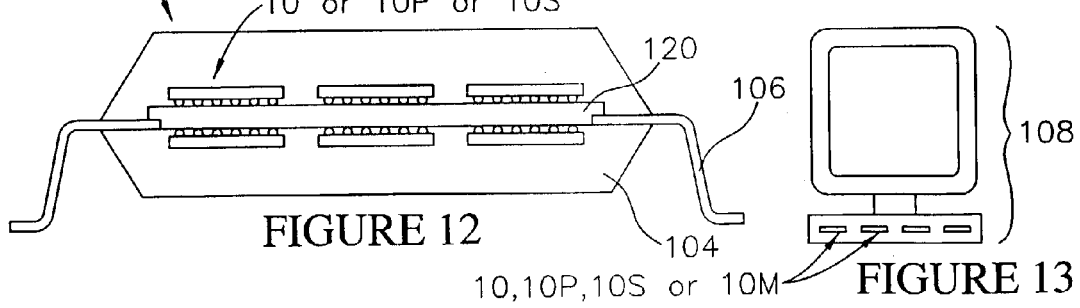

SEMICONDUCTOR COMPONENTS HAVING STACKED DICE

CROSS REFERENCE TO RELATED APPLICATIONS

This application is related to Ser. No. 10/351,888 filed Jan. 27, 2003, and to Ser. No. 11/167,031 filed Jun. 24, 2005.

FIELD OF THE INVENTION

This invention relates generally to semiconductor manufacture and packaging. More particularly, this invention relates to semiconductor components having stacked dice, to methods for fabricating the components, and to systems incorporating the components.

BACKGROUND OF THE INVENTION

High speed semiconductor components, such as packages containing digital logic dice, are typically bumped during manufacture, and then flip chip mounted on a supporting substrate, such as a package substrate, a module substrate or a printed circuit board (PCB). With flip chip mounting, bumps, pins or other terminal contacts on the component, are bonded to mating contacts on the supporting substrate. One well known type of flip chip mounting is known as controlled collapse chip connection (C4).

Flip chip packaging methods are low cost and facilitate the volume manufacture of semiconductor components, particularly semiconductor packages. In addition, flip chip packaging methods provide improved electrical and thermal performance relative to traditional packaging methods that employ wire bonding.

As the semiconductor industry advances, manufacturers are developing different packaging methods that make the components smaller, and provide a more reliable and efficient protective and signal transmission system for the semiconductor dice contained in the components. One technique for expanding the capabilities of a component is to incorporate multiple dice into a single component, such as by stacking two or more dice. For example, systems in a package (SIPs), can include dice stacked on a substrate, each of which has a different configuration (e.g., memory vs. processing). The stacked dice provide increased integration, security and performance in a component, and decrease the outline (i.e., footprint) of the component.

One aspect of semiconductor components containing stacked dice is that they are typically not fabricated using flip chip packaging methods, and do not typically include terminal contacts that allow the components to be flip chip mounted to substrates. It would be desirable to use flip chip packaging methods to fabricate various types of components, such as packages and modules, which contain stacked dice. In addition, it would be desirable to fabricate various types of components with terminal contacts that allow flip chip mounting of the components.

The present invention is directed to components containing multiple stacked dice, which are fabricated using flip chip packaging methods and include flip chip features. The present invention is also directed to wafer level methods for fabricating the components, and to systems incorporating the components.

SUMMARY OF THE INVENTION

In accordance with the present invention, semiconductor components having stacked dice and flip chip features are provided. Also provided are methods for fabricating the components using wafer level packaging, and systems incorporating the components.

In an illustrative embodiment, a package component includes a pair of stacked dice including a base die and a secondary die. The base die and the secondary die can have different electrical configurations such as memory, processing or an application specific configuration, such that the package component can be configured as a system in a package. In addition, the base die has a peripheral outline that is larger than that of the secondary die, and the same as the footprint of the package component, such that a chip size package can be provided.

The base die includes two sets of contacts including a set of stacking contacts for flip chip mounting the secondary die to the base die, and a set of interconnect contacts configured as an internal signal transmission system, and a physical structure for supporting a terminal contact system of the package component. The package component also includes an encapsulant on the base die encapsulating the interconnect contacts, an underfill layer between the dice, and terminal contacts configured for flip chip mounting the package component to a supporting substrate.

The wafer level method for fabricating the package component includes the steps of providing a base wafer containing a plurality of base dice, and flip chip mounting the secondary dice to the base dice on the base wafer. In addition, the method includes the steps of forming the interconnect contacts on the base dice, forming an encapsulant on the base die and the interconnect contacts, and forming underfill layers between the base dice and the secondary dice. In addition, the method includes the steps of planarizing the secondary dice, the encapsulants and the interconnect contacts, forming terminal contacts on the planarized interconnect contacts, and then singulating the base wafer into the package components.

An alternate embodiment package component includes a base die, and at least stacked two dice including a first secondary die flip chip mounted to the base die, and a second secondary die flip chip mounted to the first secondary die. An alternate embodiment module component includes two or more base dice, and two or more secondary dice flip chip mounted to the base dice.

The package components and the module component can be used to construct various electrical systems such as systems in a package (SIPs), module systems and computer systems.

BRIEF DESCRIPTION OF THE DRAWINGS

FIG. 1A is an enlarged schematic bottom view of a package component constructed in accordance with the invention;

FIG. 1B is a enlarged schematic side elevation view of the package component;

FIG. 1C is an enlarged schematic cross sectional view of the package component taken along section line 1C-1C of FIG. 1A;

FIG. 10A is an enlarged schematic bottom view of an alternate embodiment module component having two or more base dice and two or more stacked dice on the base dice;

FIG. 10B is an enlarged schematic cross sectional view of the alternate embodiment module component taken along section line 10B-10B of FIG. 10A;

FIG. 11A is a schematic plan view of a module system constructed using the package component;

FIG. 11B is an enlarged schematic cross sectional view of the module system taken along section line 11B-11B of FIG. 11A;

FIG. 12 is an enlarged schematic cross sectional view of a package in a system constructed using the package component; and FIG. 13 is an enlarged schematic cross sectional view of a computer system constructed using the package component or the module component.

DETAILED DESCRIPTION OF THE PREFERRED EMBODIMENTS

Figure 1D:
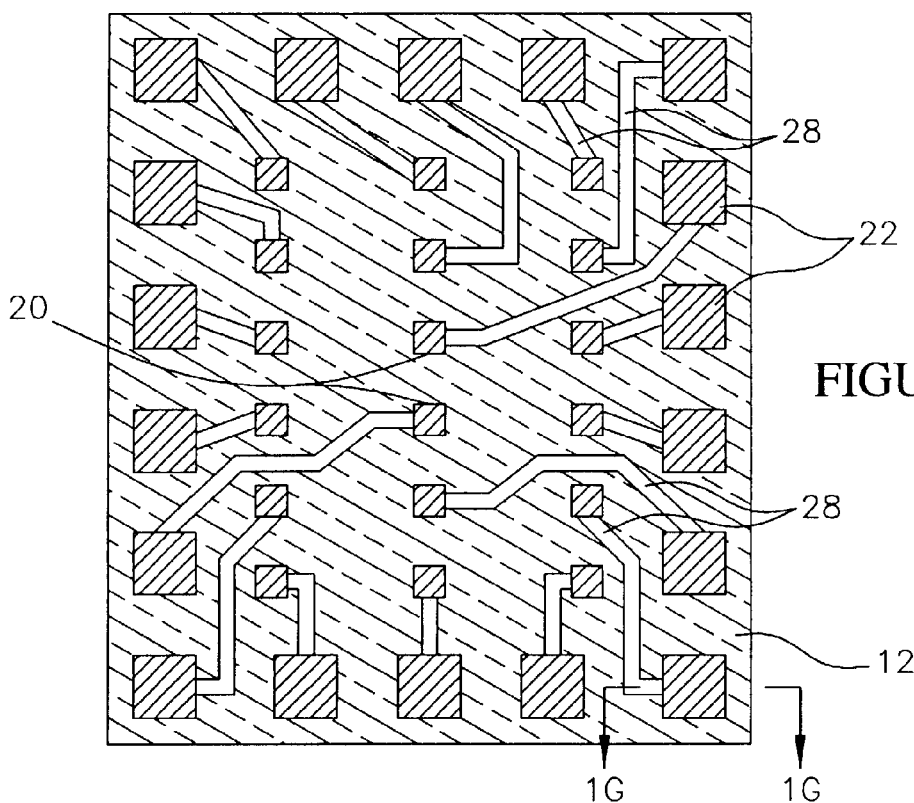
FIG. 1D is an enlarged schematic cross sectional view of the package component taken along section line 1D-1D of FIG. 1C.

As used herein, the term "semiconductor component" refers to an electronic element that includes a semiconductor die. Exemplary semiconductor components include semiconductor packages and semiconductor modules.

The term "wafer level packaging method" means a semiconductor packaging method in which semiconductor wafers are used to make semiconductor components.

Referring to FIGS. 1A-1C, a package component 10 constructed in accordance with the invention is illustrated. As shown in FIG. 1C, the package component 10 includes a base die 12 (first die in some of the claims), and a secondary die 14 (second die in some of the claims) which is stacked and flip chip bonded to the base die 12. The package component 10 also includes an encapsulant 16 formed on the base die 12 and on the edges of the secondary die 14.

The package component 10 also includes an array of electrically conductive terminal contacts 18 configured for signal transmission to and from the package component 10. In the illustrative embodiment the terminal contacts 18 comprise metal bumps or balls. However, the terminal contacts 18 can also comprise pins, polymer bumps, spring contacts or any terminal contact known in the art. Also in the illustrative embodiment, there are eighteen terminal contacts 18, arranged in a peripheral array. However, this arrangement is merely exemplary, and the terminal contacts 18 can be arranged in any dense area array, such as a ball grid array (BGA), or a fine ball grid array (FBGA).

The base die 12 and the secondary die 14 can comprise conventional semiconductor dice having a desired configuration. For example, each die 12, 14 can comprise a high speed digital logic device, such as a dynamic random access memory (DRAM), a static random access memory (SRAM), a flash memory, a microprocessor, a digital signal processor (DSP) or an application specific integrated circuit (ASIC). In addition, each die 12, 14 can have a different configuration. For example, the base die 12 can comprise an application specific device, and the secondary die 14 can comprise a memory device. The package component 10 can thus be configured as a system in a package (SIP).

The base die 12 has a peripheral outline (footprint) that is identical to the peripheral outline (footprint) of the package component 10. The package component 10 can thus be considered a chip scale package (CSP). In addition, the peripheral outline of the base die 12 is larger than the peripheral outline of the secondary die 14. In the illustrative embodiment, the base die 12, the secondary die 14 and the package component 10 all have generally rectangular peripheral outlines, but other polygonal outlines, such as square or hexagonal can also be utilized.

As shown in FIG. 1C, the base die 12 has a circuit side 24 and a back side 26. The circuit side 24 includes active semiconductor devices and integrated circuits 36 (FIG. 1G) fabricated using techniques that are well known in the art. The circuit side 24 of the base die 12 faces the secondary die 14, and the back side 26 of the base die 12 forms an outside surface of the package component 10.

As shown in FIG. 1D, the base die 12 includes a set of stacking contacts 20 (first contacts in some of the claims) on the circuit side 24, which are configured for stacking the secondary die 14 on the base die 12 using flip chip bonding techniques. The base die 12 also includes a set of interconnect contacts 22 (second contacts in some of the claims) on the circuit side 24 in electrical communication with the first contacts 20. The base die 12 also includes patterns of conductors 28 configured to establish electrical communication between the stacking contacts 20 and the interconnect contacts 22.

Figure 1E:
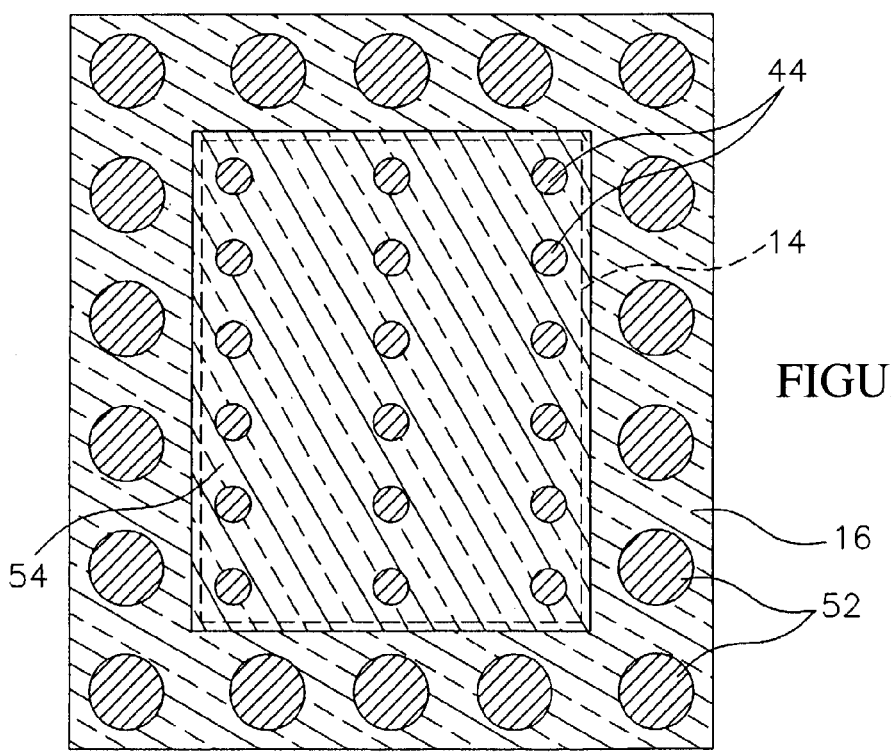
FIG. 1E is an enlarged schematic cross sectional view of the package component taken along section line 1E-1E of FIG. 1C.
Figure 1F:
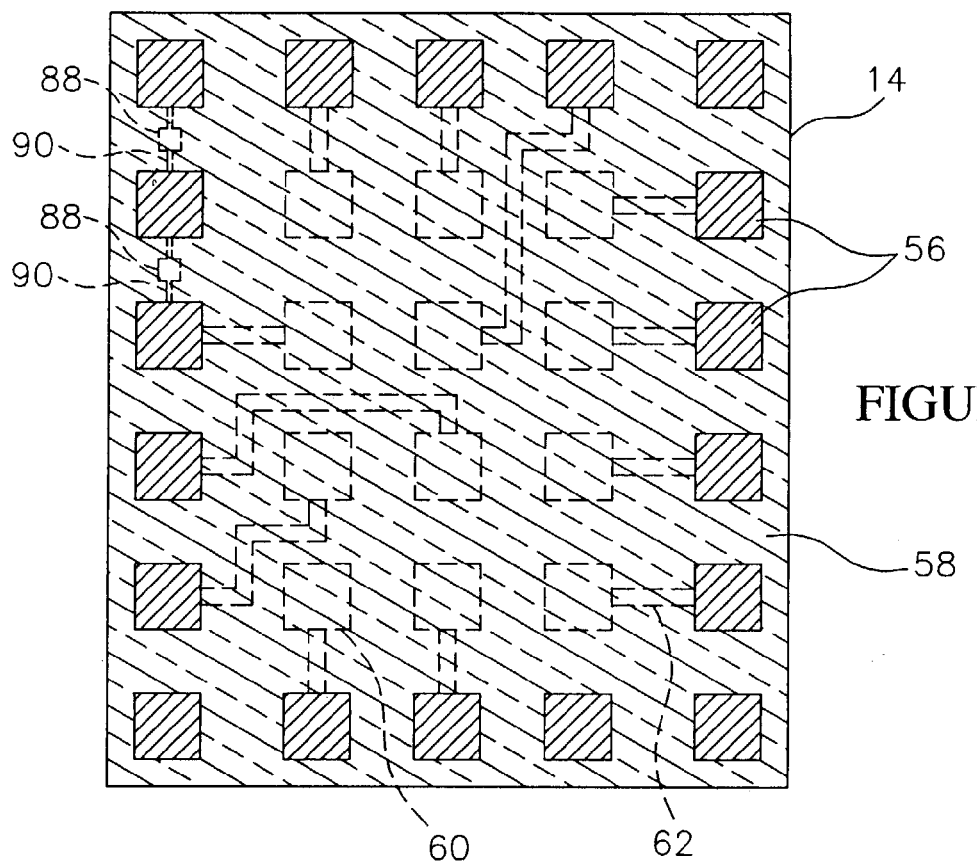
FIG. 1F is an enlarged schematic cross sectional view of the package component taken along section line 1F-1F of FIG. 1C.
Figure 1G:
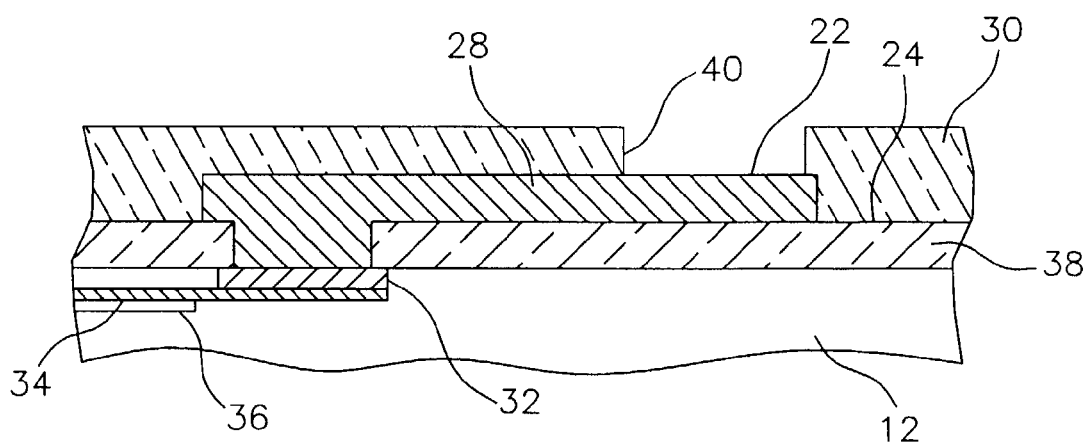
FIG. 1G is an enlarged schematic cross sectional view taken of the package component taken along section line 1G-1G of FIG. 1D.

As shown in FIG. 1G, the conductors 28 also establish electrical communication between the interconnect contacts 22 and the integrated circuits 36 contained on the base die 12. In the illustrative embodiment, the conductors 28 are formed on a die passivation layer 38 of the base die 12 in electrical communication with die contacts 32, such as the device bond pads for the base die 12. In addition, internal conductive traces 34 in the base die 12 complete the electrical path between the integrated circuits 36 and the interconnect contacts 22. As will be further explained, the conductors 28 can comprise a redistribution layer (RDL) formed using a subtractive process (e.g., etching) or an additive process (e.g., sputtering, or a combination of sputtering and plating) as is known in the art.

As also shown in FIG. 1G, the base die 12 includes an insulating layer 30 configured to electrically insulate and protect the conductors 28. The insulating layer 30 also seals and protects the circuit side 24 of the base die 12. The insulating layer 30 can comprise a polymer, such as polyimide or BCB, an oxide such as silicone dioxide, or a glass, such as borophosphosilicate glass (BPSG). In addition, the insulating layer 30 includes openings 40 aligned with the interconnect contacts 22, and also with the stacking contacts 20.

Referring again to FIG. 1C, the secondary die 14 includes a circuit side 46 and a thinned back side 48. The circuit side 46 of the secondary die 14 faces the base die 12, and the thinned back side 48 forms an outside surface of the package component 10. The secondary die 14 also includes bumped contacts 44 bonded to the stacking contacts 20 on the base die 12. In the illustrative embodiment the bumped contacts 44 comprise metal bumps or balls. However, the bumped contacts 44 can also comprise metal pins, conductive polymer bumps or other types of raised contacts that are known in the art. As shown in FIG. 1E, the bumped contacts 44 on the secondary die 14 have a grid pattern that exactly matches a grid pattern of the stacking contacts 20 (FIG. 1D) on the base die 12. However, the grid patterns need not match exactly, as some of the stacking contacts 20 may not have a corresponding bumped contact 44, and some of the bumped contacts 44 may not have a corresponding stacking contact 20.

In addition, the secondary die 14 includes conductors 42 on the circuit side 46 configured to establish electrical communication between the bumped contacts 44 and the integrated circuits contained on the secondary die 14, substantially as previously described for the conductors 28 (FIG. 1G) on the base die 12. The secondary die 14 also includes an insulating layer 50 which electrically insulates the conductors 42 and the circuit side 46 of the secondary die 14.

As also shown in FIG. 1C, the package component 10 includes bumped interconnect contacts 52 bonded to the interconnect contacts 22 on the base die 12, and embedded in the encapsulant 16 for the package component 10. In the illustrative embodiment the bumped interconnect contacts 52 comprise metal bumps or balls. However, the bumped interconnect contacts 52 can also comprise metal pins, conductive polymer bumps or other types of raised contacts that are known in the art.

As shown in FIG. 1E, the encapsulant 16 has a picture frame shape, with an outside peripheral shape that matches the base die 12, and an inside peripheral shape that matches the secondary die 14. Stated differently, the encapsulant is contained on the base die 12 in an area bounded by the peripheral outline of the secondary die 14 and the peripheral outline of the base die 12.

The encapsulant 16 can comprise a polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. The encapsulant 16 can alternately comprise a laser imageable material, which can be patterned using a stereographic lithography process to be hereinafter described.

As also shown in FIG. 1C, the package component 10 includes an underfill layer 54 that helps to bond the secondary die 14 to the base die 12, to fill the space therebetween and to absorb thermal stresses. The underfill layer 54 can comprise a conventional underfill polymer such as a curable silicone, epoxy or polyimide material. The underfill layer 54 can also comprise a thermoset polymer underfill film, such as an underfill film manufactured by 3M Corporation of Minneapolis, Minn.

As shown in FIG. 1F, the thinned back side 48 (FIG. 1C) of the secondary die 14 includes an array of terminal contact pads 56 wherein the terminal contacts 18 (FIG. 1C) are bonded. The thinned back side 48 can also include an insulating layer 58 having openings aligned with the terminal contact pads 56. In the illustrative embodiment, the terminal contact pads 56 have a peripheral pattern that matches the peripheral pattern of the bumped interconnect contacts 52. However, this arrangement is merely exemplary and other area arrays for the terminal contacts 18, such as a ball grid array (BGA) or fine ball grid array (FBGA) can be employed. For example, as shown by the dashed lines in FIG. 1F, additional BGA terminal contact pads 60 and BGA conductors 62 can be employed to form a ball grid array of terminal contacts 18 (second terminal contacts in some of the claims) on the thinned back side 48 of the secondary die 14. In this case an additional insulating layer (not shown) can be formed on the thinned base side 48 for electrically insulating the terminal contact pads 60 and the BGA conductors 62 from the bulk silicon.

As also shown in FIG. 1F, additional electrical elements 88, such as one or more capacitors, and conductors 90 electrically connecting the electrical elements 88 to the terminal contact pads 56, can also be formed on, or mounted to, the circuit side 24 of the base die 12. In addition, the electrical elements 88 can be embedded in the encapsulant 16 (FIG. 1C). For example, surface mount capacitors having an extremely small height (e.g., 11 mils) are commercially available from AVX Corporation of Myrtle Beach, S.C. One suitable capacitor is a #0201 from AVX. This type of capacitor is useful for reducing noise in the package component 10P. Other manufacturers of electrical elements such as capacitors include Taiyo, Yuden and Murata.

Figure 2:
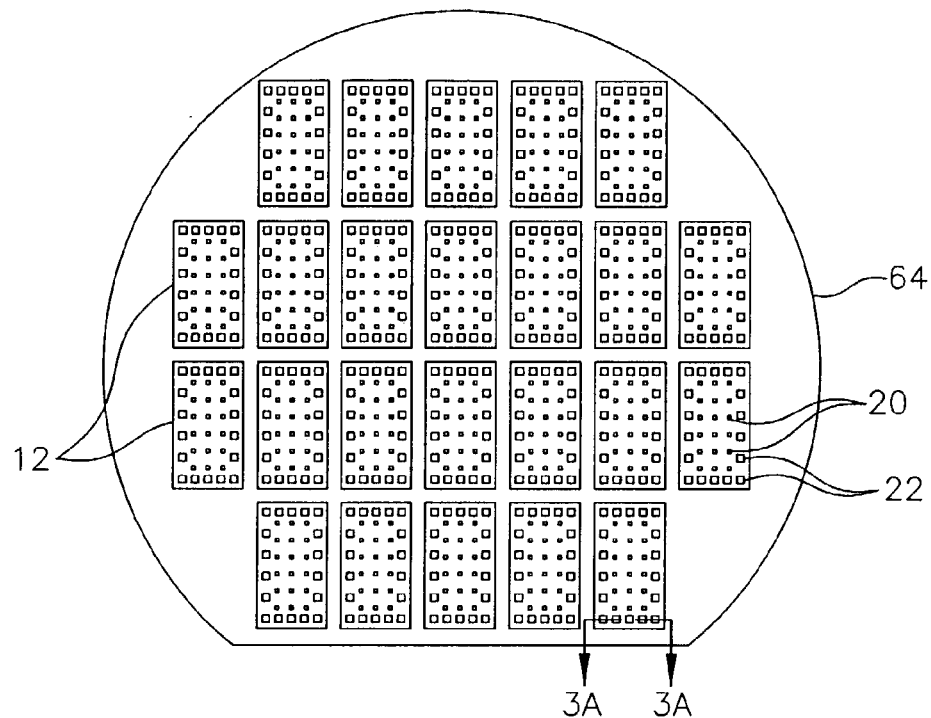
FIG. 2 is a plan view of a base wafer used in the fabrication of the package component.
Figure 3A:
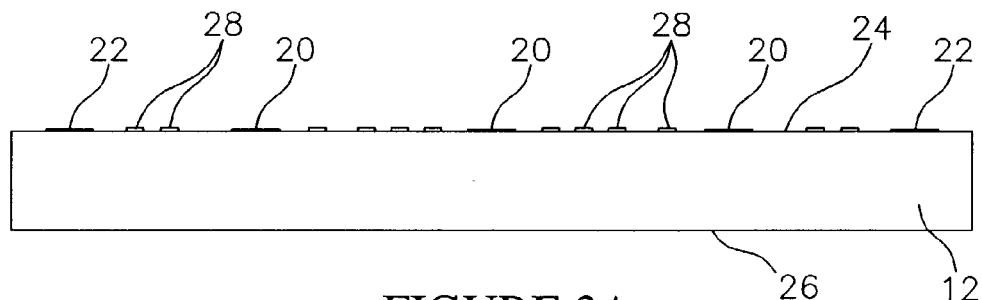
FIG. 3A is an enlarged schematic cross sectional view of a base die of the base wafer taken along section line 3A-3A of FIG. 2.
Figure 3B:
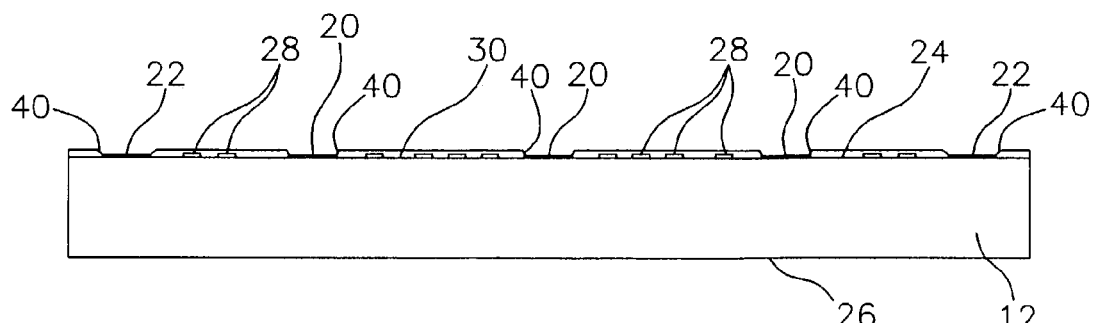
FIG. 3B is an enlarged schematic cross sectional view of the base wafer following an insulating step.

Referring to FIGS. 2, 3A and 3B, initial steps in a method for fabricating the package component 10 are illustrated. Initially, as shown in FIG. 2, a base wafer 64 containing a plurality of base dice 12 is provided. As shown in FIG. 3A, the stacking contacts 20, the interconnect contacts 22 and the conductors 28 are formed on the circuit side 24 of each die 12 in electrical communication with the die contacts 32 (FIG. 1G) and integrated circuits 36 (FIG. 1G) on the die 12.

The stacking contacts 20, the interconnect contacts 22 and the conductors 28 can be formed on the circuit sides 24 of the base dice 12 using known techniques, such as deposition and patterning of one or more redistribution layers in electrical communication with the die contacts 32 (FIG. 1G) for the base dice 12. Redistribution layers are widely used in semiconductor manufacture to customize the signal transmitting and terminal contact configuration of dice having standardized bond pad configurations. One suitable redistribution process is described in U.S. Pat. No. 5,851,911 to Farnworth, which is incorporated herein by reference. Alternately, rather than forming the stacking contacts 20, the interconnect contacts 22 and the conductors 28 from a redistribution layer, the base dice 12 and the base wafer 64 can be custom fabricated with these features. As another alternative, the stacking contacts 20, the interconnect contacts 22 and the conductors 28 can comprise a tape material such as TAB tape or ASMAT available from Nitto Denko Corporation of Japan.

Following forming (or providing) of the stacking contacts 20, the interconnect contacts 22 and the conductors 28, the insulating layers 30 are formed on the circuit sides 24 of the base dice 12. The insulating layers 30 cover the conductors 28 on each base die 12, but include the openings 40 aligned with the stacking contacts 20 and the interconnect contacts 22 on each base die 12. The insulating layers 30 can comprise a polymer, such as polyimide or BCB, an oxide such as silicon dioxide, or a glass, such as borophosphosilicate glass (BPSG) formed using techniques that are known in the art, such as by blanket deposition onto the base wafer 64 to a desired thickness. In addition, the openings 40 can be formed in the insulating layers 30 using known techniques, such as by patterning and developing a photoimageable mask material and then etching through the mask material. As another alternative, the insulating layers 30 can comprise a photoimageable material such as a resist or a photoimageable polyimide. A representative thickness of the insulating layers 30 formed of a polymer can be from about 1 mil (25.4 µm) to about 12 mils (304.8 µm).

Figure 4:
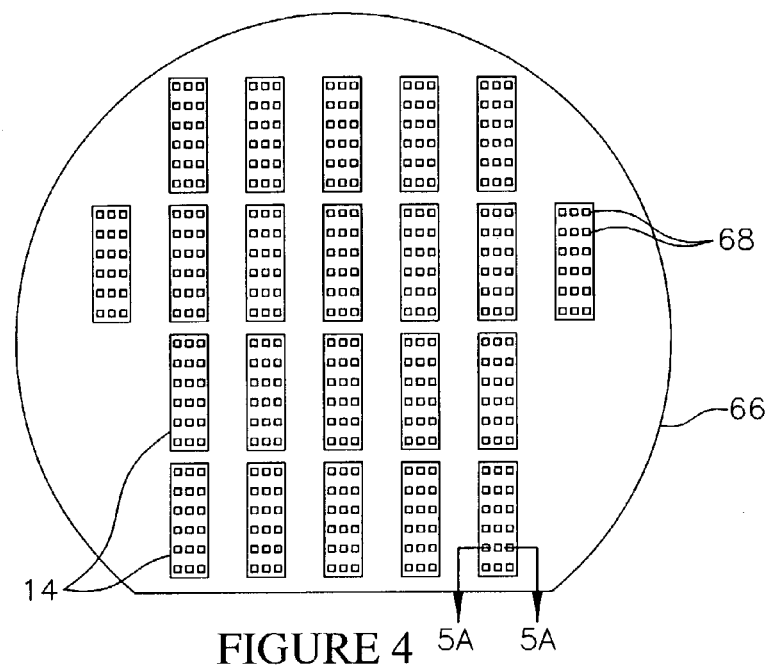
FIG. 4 is a plan view of a secondary wafer used in the fabrication of the package component of FIGS. 1A-1C.

Referring to FIGS. 4, 5A, 5B and 5C, further initial steps for fabricating the package component 10 are illustrated. As shown in FIG. 4, a secondary wafer 66 containing a plurality of secondary dice 14 is provided. As shown in FIG. 4A, the conductors 42, and bumped contact pads 68 for the bumped contacts 44 (FIG. 5C), are formed on the circuit side 46 of each secondary die 14 in electrical communication with the die contacts 32 (FIG. 1G) and integrated circuits 36 (FIG. 1G) on the die 14.

Figure 5A:
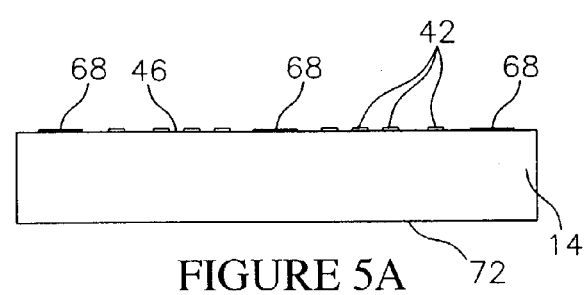
FIG. 5A is an enlarged schematic cross sectional view of a secondary die of the secondary wafer taken along section line 5A-5A of FIG. 4.

The conductors 42, and the bumped contact pads 68, can be formed on the circuit sides 46 of the secondary dice 14 using known techniques, such as deposition and patterning of one or more redistribution layers substantially as previously described for the stacking contacts 20, the interconnect contacts 22 and the conductors 28 on the base dice 12. As also previously described, rather than using a redistribution layer, the secondary dice 14 can be provided with the conductors 42 and the bumped contact pads 68. As also shown in FIG. 5A, the back sides 72 of the secondary dice 14 are not processed, but will subsequently be ground, or polished, to form the thinned back sides 48 (FIG. 1C) of the secondary dice 14.

Figure 5B:
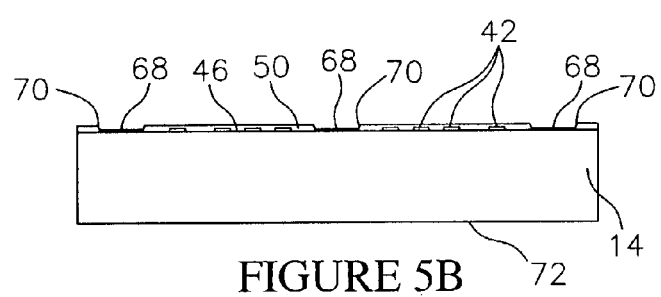
FIG. 5B an enlarged schematic cross sectional view of the secondary wafer following an insulating step of the fabrication process.

Next, as shown in FIG. 5B, the insulating layers 50 are formed on the circuit sides 46 of the secondary dice 14. The insulating layers 50 cover the conductors 42 on each secondary die 14, but include openings 70 aligned with the bumped contact pads 68 on each secondary die 14. The insulating layers 50 can comprise a polymer, such as polyimide or BCB, an oxide such as silicon dioxide, or a glass, such as borophosphosilicate glass (BPSG), formed using techniques that are known in the art, such as by blanket deposition onto the secondary wafer 66 to a desired thickness and then etching, substantially as previously described for insulating layer 30 (FIG. 3B) and openings 40 (FIG. 3B).

Figure 5C:
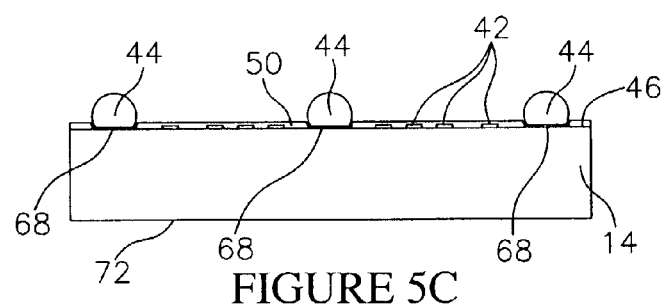
FIG. 5C an enlarged schematic cross sectional view of the secondary wafer following a bump forming step of the fabrication process.

Next, as shown in FIG. 5C, the bumped contacts 44 are formed on the bumped contact pads 68. This step can be performed by bonding, or depositing, the bumped contacts 44 on the bumped contact pads 68. For example, the bumped contacts 44 can comprise metal bumps deposited using a suitable deposition process, such as stenciling and reflow of a solder alloy. Also, rather than being formed of solder, the bumped contacts 44 can comprise another metal, or a conductive polymer material.

The bumped contacts 44 can also be formed by electrolytic deposition, by electroless deposition, or by bonding pre-fabricated balls to the bumped contact pads 68. A ball bumper can also be employed to bond pre-fabricated balls. A suitable ball bumper is manufactured by Pac Tech Packaging Technologies of Falkensee, Germany. The bumped contacts 44 can also be formed using a conventional wire bonder apparatus adapted to form a ball bond on the bumped contact pads 68, and then to sever the attached wire. Still further, the bumped contacts 44 can comprise metal or metal plated pins formed on, or bonded to, the bumped contact pads 68.

Following formation of the bumped contacts 44, the base wafer 64 is singulated (diced) into the individual secondary dice 14. The singulating step can be performed using a sawing method or another singulation method, such as cutting with a laser or a water jet, or be etching the secondary wafer 66 with a suitable wet or dry etchant.

Figure 6:
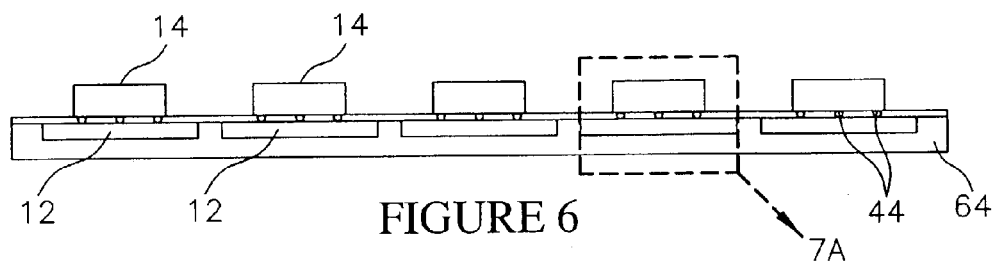
FIG. 6 is a schematic cross sectional view of the base wafer and the secondary wafer during a bonding step of the fabrication process.
Figure 7A:
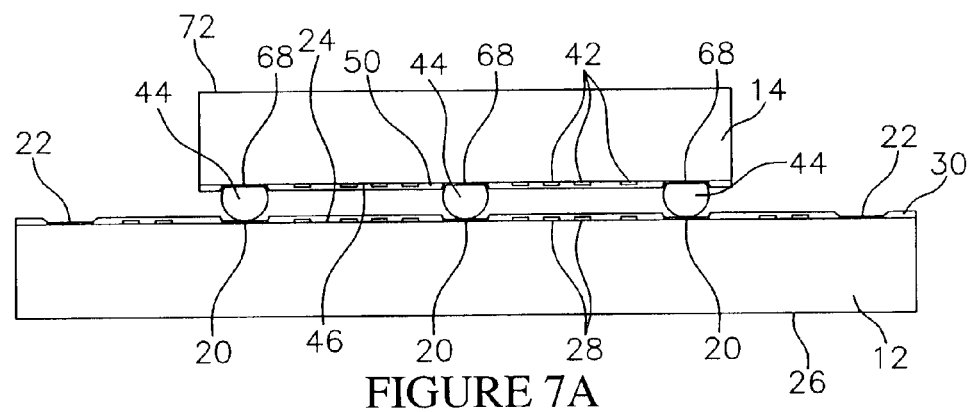
FIG. 7A is an enlarged schematic cross sectional view of the base wafer and the secondary wafer taken along section line 7A of FIG. 6.

Next, as shown in FIG. 6, the singulated secondary dice 14 are placed on the base dice 12 contained on the base wafer 64. The secondary dice 14 can be placed on the base dice using conventional equipment, such as a vacuum pick and place mechanism, or an aligner bonder under computer control. As shown in FIG. 7A, the secondary dice 14 are placed on the base dice 12 with the bumped contacts 44 on the secondary dice 14 aligned, and in physical contact with the stacking contacts 20 on the base dice 12.

However, prior to placing the secondary dice 14 on the base dice 12, each secondary die 14 can optionally be individually tested using techniques that are known in the art. Testing of the secondary dice 14 can be as desired, from gross functionality testing to certification as a known good die (KGD). For example, testing can include any test used in the industry, including but not limited to: gross functionality testing, cell defect testing, opens testing, shorts testing, pad leakage testing, parametric testing, and burn-in testing.

Figure 7B:
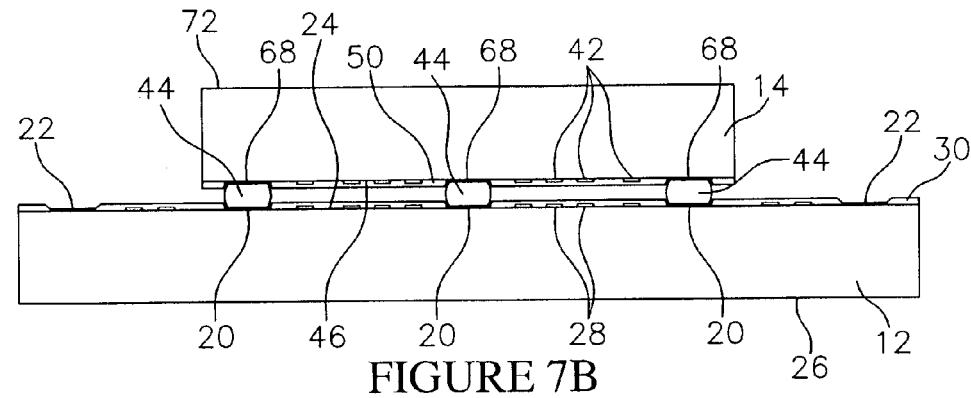
FIG. 7B is an enlarged schematic cross sectional view of the base wafer and the secondary wafer following the bonding step of the fabrication process.

Next, as shown in FIG. 7B, following the secondary die placing step, the bumped contacts 44 on the secondary dice 14 are bonded to the stacking contacts 20 on the base dice 12. If the bumped contacts 44 are formed of solder, or another metal, the bonding step can be performed by heating and reflowing the bumped contacts 44 to form metallurgical bonds with the stacking contacts 20. If the bumped contacts 44 are formed of a conductive polymer, other bonding techniques, such as chemical reaction, or UV curing, can be employed. If the bumped contacts 44 comprise metal or metal plated pins a welding, soldering or brazing process can be employed.

Figure 7C:
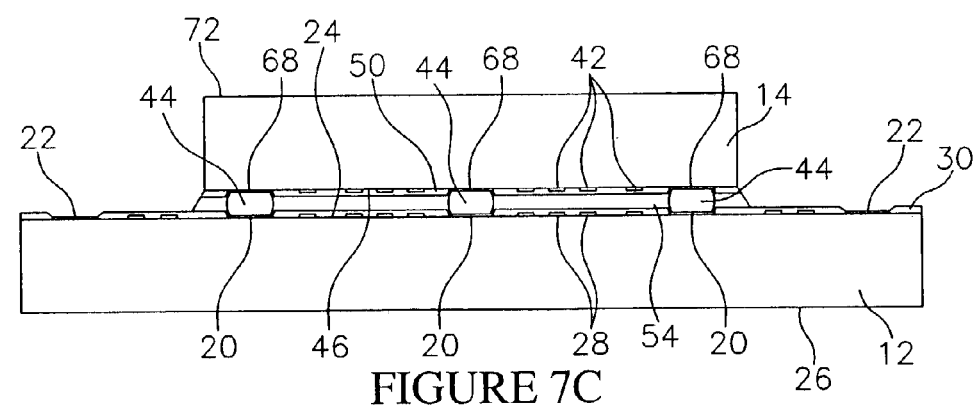
FIG. 7C is an enlarged schematic cross sectional view of the base wafer and the secondary wafer following an underfill step of the fabrication process.

Next, as shown in FIG. 7C, the underfill layer 54 is formed between the singulated secondary dice 14 and the base dice 12 contained on the base wafer 64. The underfill layer 54 can comprise a conventional underfill polymer such as a curable silicone, epoxy or polyimide material. The underfill layer 54 can also comprise a thermoset polymer underfill film, such as an underfill film manufactured by 3M Corporation of Minneapolis, Minn. The underfill layer 54 can be formed using a conventional process such as by injection of a curable material in the spaces between the secondary dice 14 and the base dice 12. In this case a "wicking" or "capillary" underfill material can be employed. Alternately, a "no flow" underfill material can be placed on either of the circuit sides 24 or 46 of the secondary dice 14 or the base dice 12, prior to the bonding step.

Figure 7D:
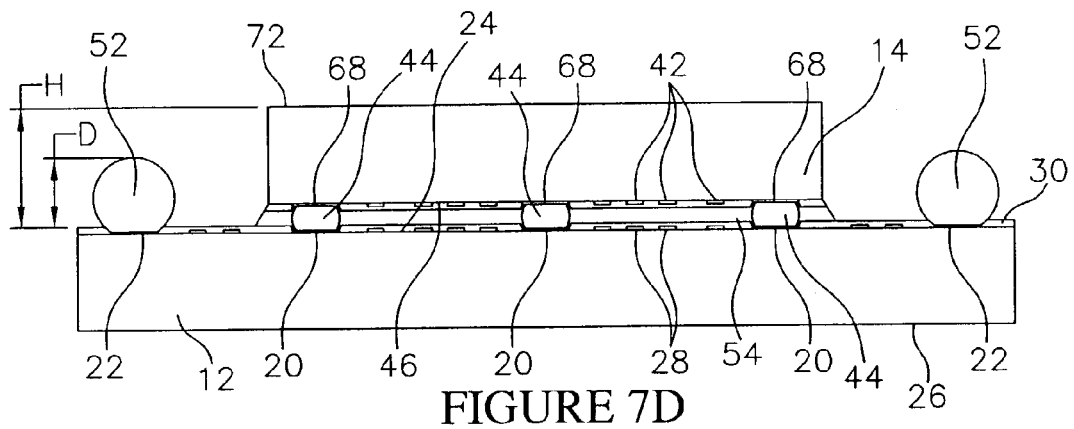
FIG. 7D is an enlarged schematic cross sectional view of the base wafer and the secondary wafer following a bump contact forming step of the fabrication process.

Next, as shown in FIG. 7D, the bumped interconnect contacts 52 are formed on the base dice 12 contained on the base wafer 64. The bumped interconnect contacts 52 can be formed on the interconnect contacts 22 of solder, another metal or a conductive polymer, using a deposition or bonding process, substantially as previously described for the bumped contacts 44 on the secondary dice 14. The bumped interconnect contacts 52 can also comprise metal or plated metal pins bonded to the interconnect contacts 22 using a bonding process such as welding, soldering or brazing.

The diameter D of the bumped contacts 44 can be selected as required with a range of about 0.005-in (0.127 mm) to about 0.016-in (0.400 mm), or larger, being representative. As shown in FIG. 7D, the bumped interconnect contacts 52 can have a diameter D, that is less than the height H of the back side 72 of the secondary die 14 measured from the surface of the base die 12. As will be further explained, the bumped interconnect contacts 52 and the secondary die 14 will be planarized so that the surfaces of the bumped interconnect contacts 52 are substantially planar to the thinned back side 48 of the secondary die 14.

Figure 7E:
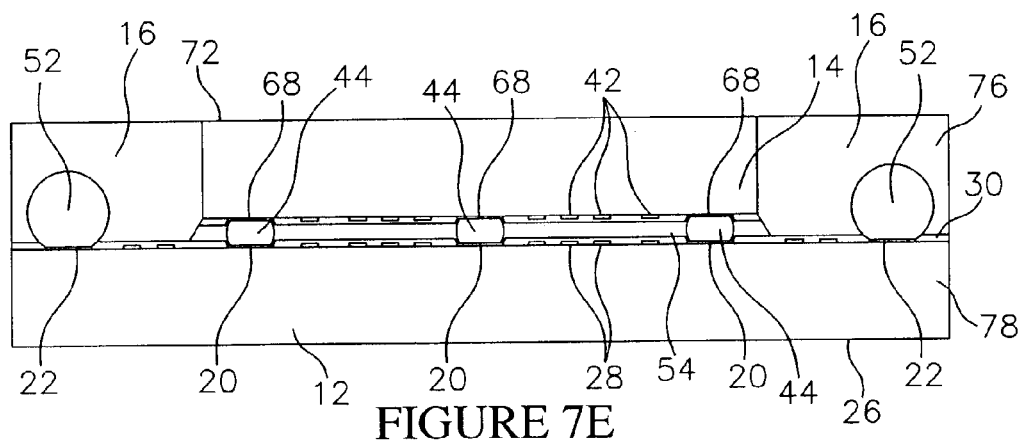
FIG. 7E is an enlarged schematic cross sectional view of the base wafer and the secondary wafer following an encapsulating step of the fabrication process.

Next, as shown in FIG. 7E, the encapsulants 16 are formed on the base dice 12 contained on the base wafer 64. Each encapsulant 16 has a picture frame outline, substantially as previously described and shown in FIG. 1E. The encapsulants 16 function to electrically insulate and encapsulate the bumped interconnect contacts 52. In addition, the encapsulants 16 function to at least partially encapsulate or pot the secondary dice 14 to the base dice 12. Further, the encapsulants 16 function to at least partially support the terminal contacts 18.

Following a base wafer 64 singulating step to be hereinafter described, the peripheral edges 76 of the encapsulant 16 will be substantially planar to the peripheral edges 78 of the base die 12 to which it is attached. Further, each encapsulant 16 substantially covers a picture frame shaped area on the base die 12 bounded by the peripheral edges of the secondary die 14, and the peripheral edges 78 of the base die 12.

The encapsulants 16 can comprise an epoxy, a silicone, a polyimide or a transfer molded underfill compound (MUF) having selected fillers. One suitable curable polymer material is manufactured by Dexter Electronic Materials of Rocky Hill, Conn. under the trademark "HYSOL" FP4450. In addition, each encapsulant 16 can be formed with a desired thickness and shape using a suitable deposition process, such as deposition through a nozzle, screen printing, stenciling, stereographic lithography or transfer molding.

For example, a nozzle deposition apparatus, such as a material dispensing system, manufactured by Asymtek of Carlsbad, Calif., can be used to form the encpasulants 16. Following deposition, the encapsulants 16 can be cured to harden. Curing of the above identified polymer material can be performed by placement of the base wafer 64 in an oven at a temperature of about 90° to 165° C. for about 30 to 60 minutes.

With stereo lithography the encapsulants 16 can comprise a laser imageable material, such as a Cibatool SL 5530 resin manufactured by Ciba Specialty Chemicals Corporation. In this case, the laser imageable material can be patterned and developed using a laser beam to provide an exposure energy. A stereo lithography system for performing the process is available from 3D Systems, Inc. of Valencia, Calif. In addition, a stereographic lithographic process (3-D) is described in U.S. application Ser. No. 09/259,142, to Farnworth et al. filed on Feb. 26, 1999, and in U.S. application Ser. No. 09/652,340, to Farnworth et al. filed on Aug. 31, 2000, both of which are incorporated herein by reference.

Figure 7F:
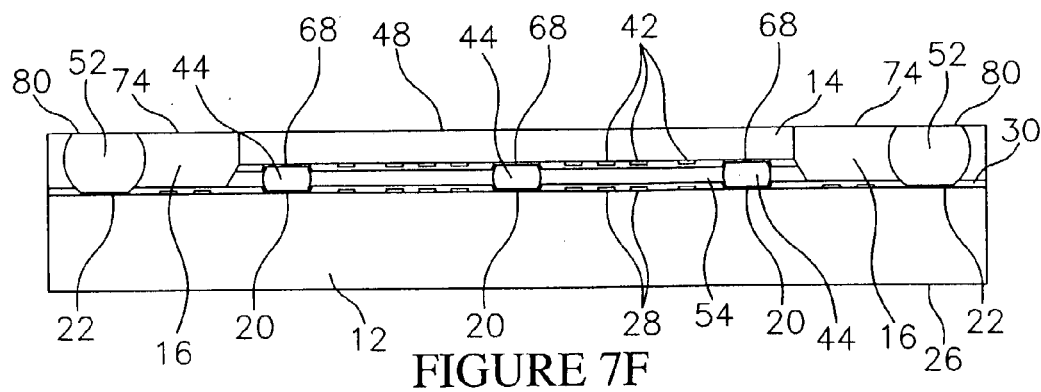
FIG. 7F is an enlarged schematic cross sectional view of the base wafer and the secondary wafer following a thinning step of the fabrication process.

Following formation of the encapsulants 16 and as shown in FIG. 7F, a planarizing step is performed in which the encapsulants 16 are planarized to expose planar contact surfaces 80 on the bumped interconnect contacts 52. In addition, the planarizing step can be performed such that the secondary dice 14 are thinned and planarized as well. As with the previous steps, the planarizing step is performed with the base dice 12 still contained on the base wafer 64, and the secondary dice 14 attached to the base dice 12. The planarizing step forms a planarized surface 74 that includes the planar contact surfaces 80 on the bumped interconnect contacts 52, and the thinned back side 48 of the secondary dice 14.

The planarizing step can be performed using a mechanical planarization apparatus (e.g., a grinder). One suitable mechanical planarization apparatus is manufactured by Okamoto, and is designated a model no. VG502. Another suitable mechanical planarization apparatus is manufactured by Accretech USA Inc., of Oakland, N.J. and is designated a model PG300RM wafer thinning system. The planarizing step can also be performed using a chemical mechanical planarization (CMP) apparatus. A suitable CMP apparatus is commercially available from a manufacturer such as Westech, SEZ, Plasma Polishing Systems, or TRUSI. The planarizing step can also be performed using an etch back process, such as a wet etch process, a dry etch process or a plasma etching process.

By way of example and not limitation, the planarizing step can be performed such that the secondary dice 14 are thinned to a thickness of about 1 mil (25.4 µm) to about 27 mils (685.8 µm). However, although the planarizing step is illustrated as thinning the secondary dice 14, the diameter D (FIG. 7D) of the bumped interconnect contacts 52 can be selected such that the secondary dice 14 are not thinned. For example, the diameter D can be approximately equal to, or slightly greater than, the height H of the secondary dice 14 on the base wafer 64. The planarizing step could then be end pointed at the back sides 72 of the secondary dice 14 such that the secondary dice 14 have a standard thickness (e.g., 28 mils).

Following the planarizing step, and as an optional additional step, each base die 12 and associated secondary die 14 can be tested using the planar contact surfaces 80 on the bumped interconnect contacts 52 as access points. For example, simple continuity tests can be performed to evaluate the electrical paths between the attached pairs of base dice 12 and secondary dice 14.

Figure 7G:
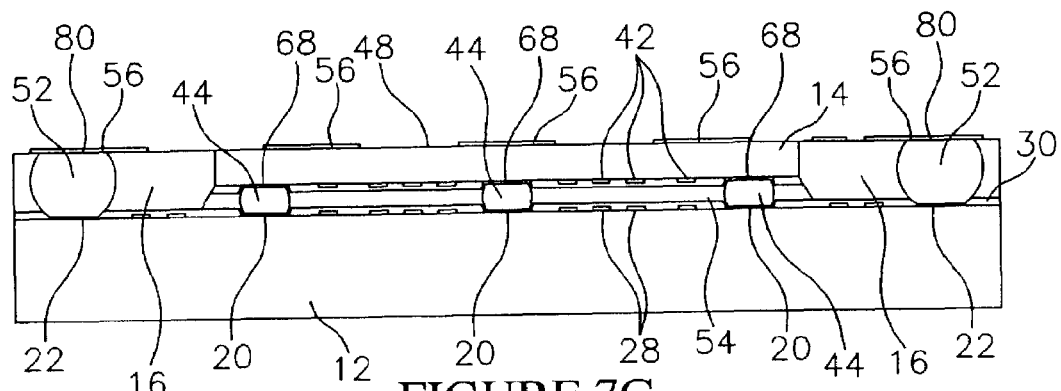
FIG. 7G is an enlarged schematic cross sectional view of the base wafer and the secondary wafer following a conductor forming step of the fabrication process.

Next, as shown in FIG. 7G, the terminal contact pads 56 can be formed on the planar contact surfaces 80 of the bumped interconnect contacts 52. However, this step is optional, as for some applications, the terminal contacts 18 can be formed directly on the planar contact surfaces 80. The terminal contact pads 56 can be formed using known techniques, such as by deposition and patterning of one or more redistribution layers, substantially as previously described for the stacking contacts 20, the interconnect contacts 22 and the conductors 28 on the base dice 12. In addition, the BGA terminal contact pads 60 (FIG. 1F) and the BGA conductors 62 (FIG. 1F) can also be formed at the same time to provide a grid array. The terminal contact pads 56 can also comprise a performed tape material such as TAB tape or ASMAT manufactured by Nitto Denko Corp. of Japan.

Figure 7H:
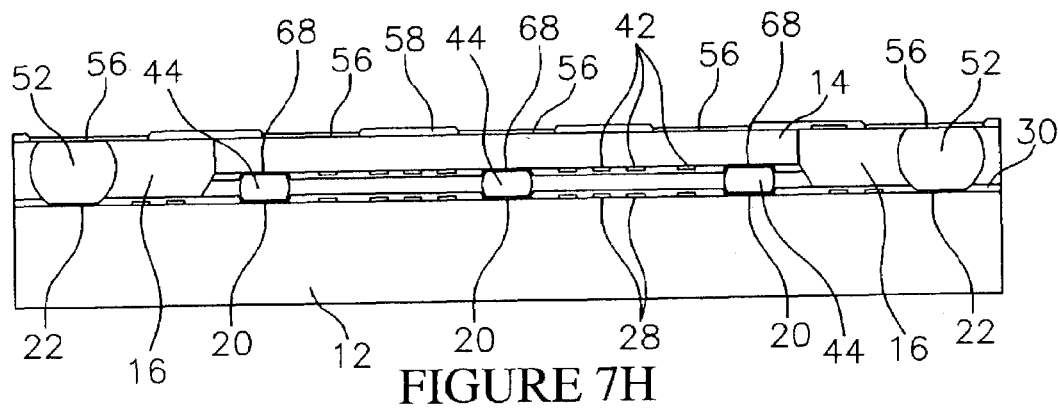
FIG. 7H is an enlarged schematic cross sectional view of the base wafer and the secondary wafer following an insulating step of the fabrication process.

Next, as shown in FIG. 7H, the insulating layer 58 can be formed while leaving the terminal contact pads 56 exposed. Again this step is optional as for some applications the insulating layer 58 will not be necessary. One such application may be where the terminal contacts 18 are formed directly on the planarized contact surfaces 80 of the bumped interconnect contacts 52. The insulating layer 58 can be formed substantially as previously described for the insulating layers 30 (FIG. 3B) and 50 (FIG. 5B).

Figure 7I:
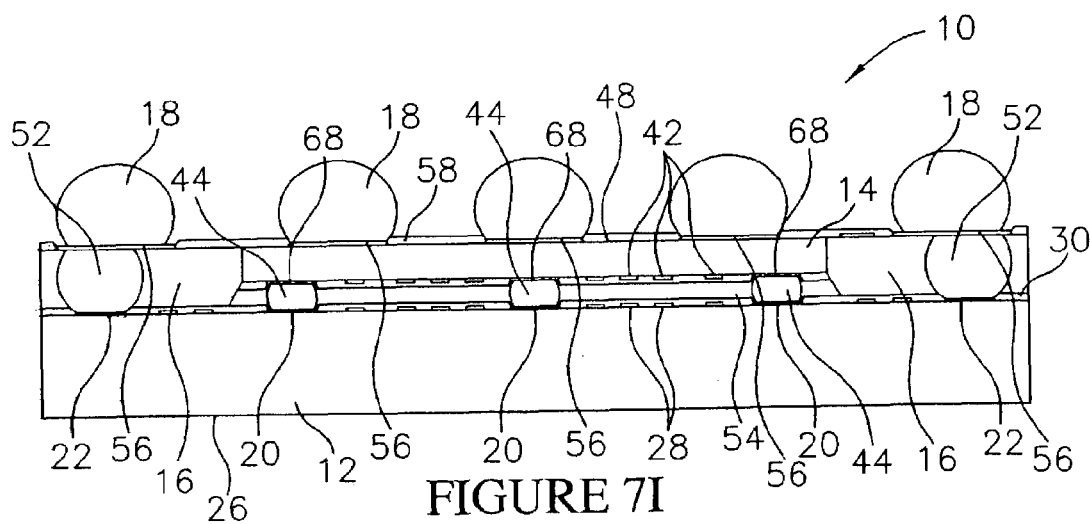
FIG. 7I is an enlarged schematic cross sectional view of the base wafer and the secondary wafer following an external contact bump forming step of the fabrication process.

Next, as shown in FIG. 7I, the terminal contacts 18 can be formed on the terminal contact pads 56. The terminal contacts 18 can comprise solder, metal, or a conductive polymer formed using a deposition or bonding process substantially as previously described for the bumped interconnect contacts 52 on the base dice 12, and the bumped contacts 44 on the secondary dice 14. As will be further explained, the terminal contacts 18 allow the package component 10 to be flip chip mounted to mating contacts on a supporting substrate. The terminal contacts 18 can also comprise metal pins or plated metal pins formed using a bonding process such as welding, soldering or brazing. As another alternative the terminal contacts 18 can comprise spring contact pins as described in U.S. Pat. No. 5,495,667 to Farnworth et al., which is incorporated herein by reference.

Figures 8A, 8B:
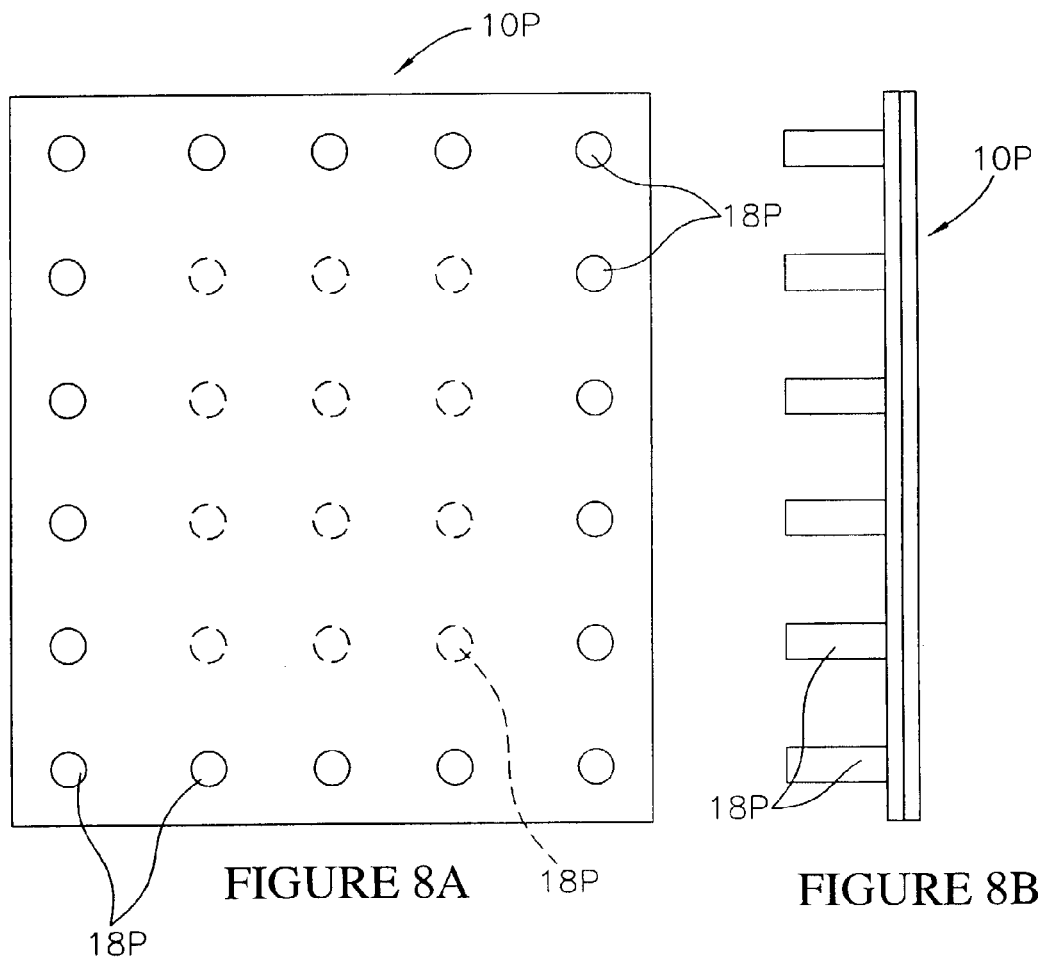
FIG. 8A is an enlarged schematic bottom view of an alternate embodiment package component having pin contacts.
FIG. 8B is an enlarged schematic side elevation view the alternate embodiment package component.
Figure 8C:
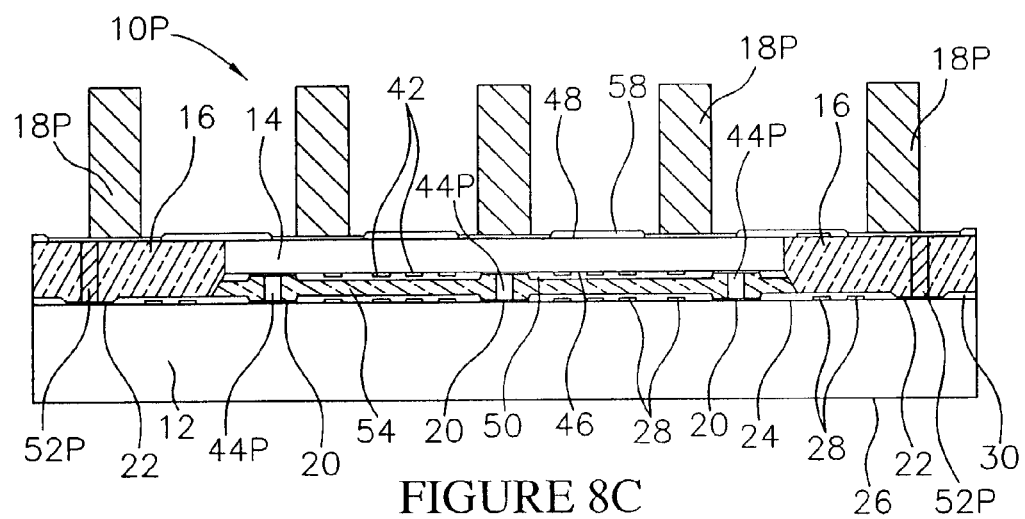
FIG. 8C is an enlarged cross sectional view of the alternate embodiment package taken along section line 8C-8C of FIG. 8A.

Referring to FIGS. 8A, 8B and 8C an alternate embodiment package component 10P is illustrated. The package component 10P is identical to the previously described package component 10 (FIGS. 1A-1G) but includes pin terminal contacts 18P rather than terminal contacts 18 (FIG. 1A). The pin terminal contacts 18P can be formed by soldering, brazing or welding pins to the terminal contact pads 56 (FIG. 1C). Alternately the pin terminal contacts 18P can be formed by wire bonding and then severing wires to a selected length. In addition, as illustrated by the dashed lines in FIG. 8A, the pin contacts 18P can be formed in a pin grid array (PGA) substantially as previously described for the terminal contacts 18 in a ball grid array (BGA).

In addition to the pin terminal contacts 18P, the package component 10P includes pin interconnect contacts 52P, in place of the bumped interconnect contacts 52 (FIG. 1C) on the base die 12. In addition, the package component 10P includes pin contacts 44P on the secondary die 14 in place of the bumped contacts 44.

Figure 9A:
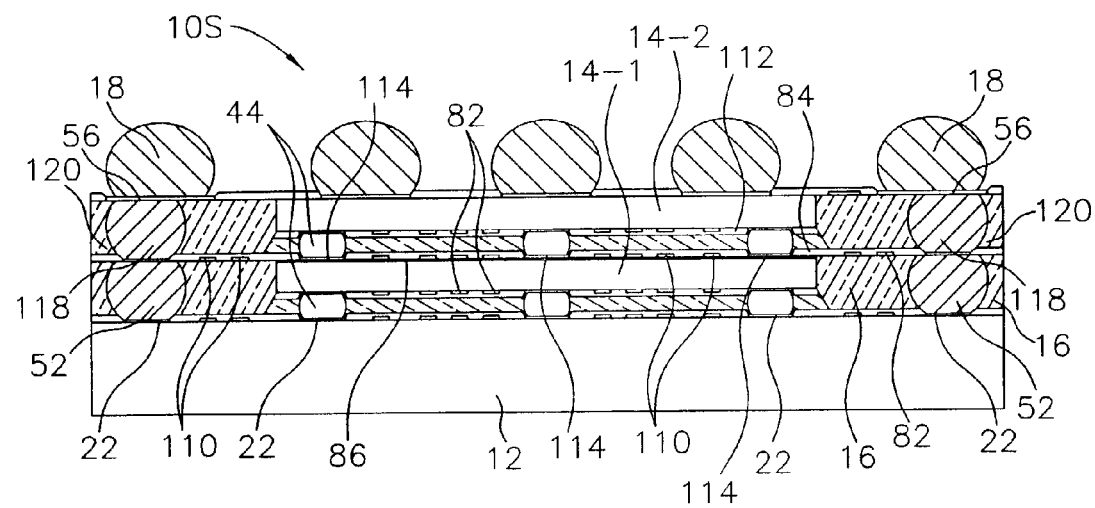
FIG. 9A is an enlarged schematic cross sectional view of an alternate embodiment package component containing two or more stacked secondary dice.

Referring to FIG. 9A, an alternate embodiment package component 10S is illustrated. The package component 10S includes the base die 12, as previously described, and two stacked, thinned secondary dice: including a first secondary die 14-1 flip chip mounted to the base die 12, and a second secondary die 14-2 flip chip mounted to the second secondary die 14-2. In addition, the first secondary die 14-1 includes bumped contacts 44 bonded to the interconnect contacts 22 on the base die 12, as previously described. The first secondary die 14-1 also includes an additional insulating layer 86 formed on the back side thereof, and an additional metallization layer comprising a pattern of conductors 110 and contact pads 114 configured for flip chip mounting the second secondary die 14-2 to the first secondary die 14-1.

The base die 12 of the package component 10S also includes an encapsulant 16 as previously described, and the conductors 110 are also formed on the encapsulant 16. In addition, the base die 12 includes bumped interconnect contacts 52, an additional set of bumped interconnect contacts 118 on the bumped interconnect contacts 52, and an additional encapsulant 120 formed on the bumped contacts 118, substantially as previously described for encapsulant 16. The package component 10S also includes terminal contact pads 56 and terminal contacts 18 bonded to the terminal contacts pads 56 as previously described. As with the previous embodiments, the base die 12, the first secondary die 14-1, and the second secondary die 14-2 can be configured and electrically interconnected such that the package component 10S forms a system in a package.

Figure 9B:
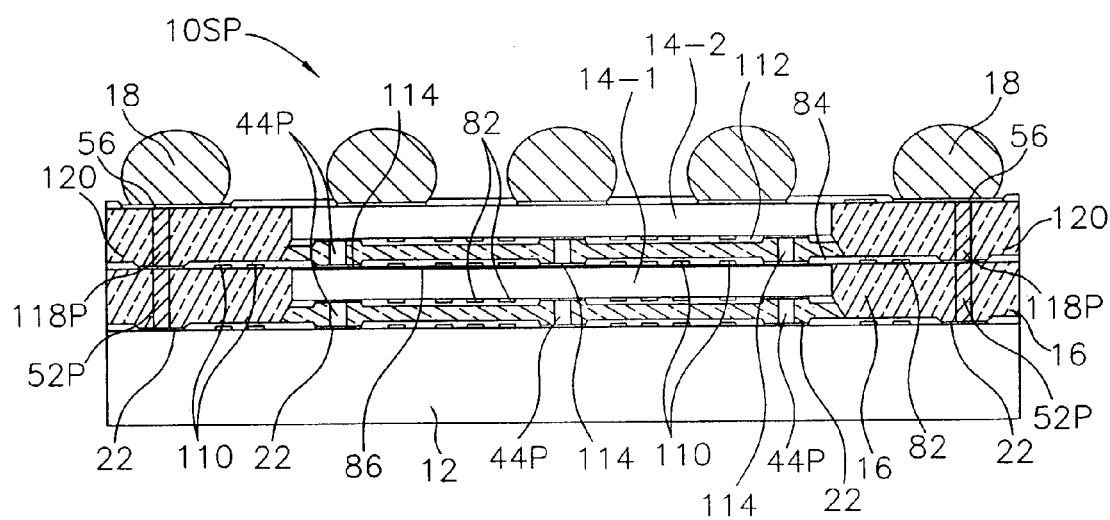
FIG. 9B is an enlarged schematic cross sectional view of an alternate embodiment package component having stacked secondary dice and pin contacts.

Referring to FIG. 9B an alternate embodiment package component 10SP is substantially identical to the package component 10S but includes pin interconnect contacts 52P in place of bumped interconnect contacts 52, and pin interconnect contacts 118P in place of bumped interconnect contacts 118. In addition, the package component 10SP includes pin contacts 44P in place of bumped contacts 44 on the stacked dice 14-1, 14-2.

Referring to FIGS. 10A and 10B, an alternate embodiment module component 10M is illustrated. The module component 10M is substantially identical to the previously described package component 10, but includes multiple base dice 12A, 12B, and multiple secondary dice 14A, 14B flip chip mounted to the base dice 12A, 12B. In the illustrative embodiment there are two base dice 12A which comprise a segment of a base wafer, and two secondary dice 14B. However, more than two base dice 12A, 12B and more than two secondary dice 14A, 14B can be used. Further, secondary dice 14A, 14B do not necessarily need to be flip chip mounted to the base dice 12A, 12B but can alternately be mounted to pads and conductors in electrical communication with the base dice 12A, 12B. In addition, the module component 10M includes a pattern of terminal contacts 18 formed along the outer periphery thereof, substantially as previously described.

Referring to FIGS. 11A and 11B, a multi chip module system 92 that includes multiple package components 10, 10P or 10S is illustrated. The multi chip module system 92 can be configured for performing a specific function such as memory storage. The multi chip module system 92 includes a module substrate 98 having patterns of electrodes 100 configured for flip chip mounting the package components 10, 10P or 10S to the module substrate 98. The terminal contacts 18 on the package components 10, 10P or 10S can be bonded to the electrodes 100 on the module substrate 98 using a suitable bonding process, such as solder reflow, thermode bonding or conductive polymer bonding. The electrodes 100 are in electrical communication with conductors 94 formed on the module substrate 98 in a required circuit pattern. In addition, the conductors 94 are in electrical communication with an edge connector 96 which provides a connection point from the outside to the multi chip module system 92.

Referring to FIG. 12, a system in a package 102 (SIP) that includes multiple package components 10, 10P or 10S is illustrated. The system in a package 102 can be configured to perform a desired electrical function such as micro processing. In addition, each package component 10, 10P or 10S can have a different electrical configuration, such as a micro controller, a microprocessor or a flash memory. The system in a package 102 includes a package substrate 120 wherein the package components 10, 10P or 10S are flip chip mounted. The package substrate 120 also includes electrodes and conductors (not shown) which electrically connect the package components 10, 10P or 10S in a required electrical configuration. The package substrate 120 also includes package leads 106 in electrical communication with the package components 10, 10P or 10S. The system in a package 102 also includes a package body 104 formed of a molded plastic, or other suitable material, which encapsulates the package substrate 120 and the package components 10, 10P or 10S.

Referring to FIG. 13, a computer system 108 includes one or more package components 10, 10P or 10S, or the module component 10M which can be mounted to the computer system 108 in a suitable manner. In addition, the package components 10, 10P or 10S, or the module component 10M can be configured to perform a desired function in the computer system 108 such as memory storage or micro processing.

Thus the invention provides improved semiconductor components, methods for fabricating the components, and systems incorporating the components. While the invention has been described with reference to certain preferred embodiments, as will be apparent to those skilled in the art, certain changes and modifications can be made without departing from the scope of the invention as defined by the following claims.

What is claimed is:

1. A semiconductor component comprising:
   a base die comprising a plurality of integrated circuits;
   a secondary die flip chip mounted to the base die having a circuit side and a backside;
   a plurality of contacts on the base die having a pattern;
   an encapsulant on the base die encapsulating the contacts and partially encapsulating the secondary die with the backside of the secondary die and an outside surface of the encapsulant forming a planar surface;
   a plurality of conductors on the planar surface in electrical communication with the contacts having a plurality of pads in an area array on the backside of the secondary die and on the encapsulant, the conductors and the pads comprising a patterned redistribution layer on the planar surface; and
   a plurality of terminal contacts for the component on the pads, the conductors configured to customize a configuration of the terminal contacts from the pattern of the contacts to the area array.

2. The semiconductor component of claim 1 wherein the secondary die comprises a thinned die and the backside of the secondary die comprises a thinned backside.

3. The semiconductor component of claim 1 wherein the encapsulant, the base die and the component have a same peripheral outline.

4. The semiconductor component of claim 1 wherein the contacts comprise bumps or balls.

5. A semiconductor component comprising:
   a base die comprising a plurality of integrated circuits, a plurality of first contacts in electrical communication with the integrated circuits, and a plurality of second contacts in electrical communication with the first contacts having planar surfaces and a pattern;
   a thinned secondary die on the base die comprising a circuit side, a thinned back side and a plurality of contacts on the circuit side bonded to the first contacts;
   an encapsulant on the base die encapsulating the second contacts;
   a plurality of conductors on the encapsulant and the thinned backside of the secondary die in electrical communication with the second contacts;
   a plurality of pads on the encapsulant and the thinned backside of the secondary die in an area array in electrical communication with the conductors; and
   a plurality of terminal contacts for the component on the pads, the conductors configured to customize a configuration of the terminal contacts from the pattern of the second contacts to the area array.

6. The semiconductor component of claim 5 wherein the second contacts comprise planarized bumps or balls.

7. The semiconductor component of claim 5 wherein the area array comprises a ball grid array or a fine ball grid array.

8. The semiconductor component of claim 5 wherein the encapsulant has a picture frame shape and extends from edges of the secondary die to peripheral edges of the base die.

9. The semiconductor component of claim 5 wherein the base die has a first peripheral outline and the secondary die has a second peripheral outline and the second contacts are located between the first peripheral outline and the second peripheral outline.

10. The semiconductor component of claim 5 further comprising an underfill layer between the base die and the secondary die.

11. The semiconductor component of claim 5 wherein the component and the base die have a same peripheral outline and the second contacts are located proximate to an edge of the peripheral outline.

12. A semiconductor component comprising:
   a base die comprising a plurality of integrated circuits, a plurality of contacts in electrical communication with the integrated circuits, and a plurality of interconnect contacts in electrical communication with the contacts having a pattern;
   a thinned secondary die on the base die comprising a circuit side, a thinned back side, and a plurality of bumped contacts on the circuit side bonded to the contacts on the base die;
   a plurality of conductors on the thinned back side of the secondary die in electrical communication with the interconnect contacts;
   a plurality of pads on the thinned back side of the secondary die in a grid array in electrical communication with the conductors, the conductors and the pads comprising a patterned redistribution layer configured to customize a configuration of the pads from the pattern of the interconnect contacts to the grid array; and a plurality of terminal contacts for the component on the pads comprising balls in a ball grid array or a fine ball grid array.

13. The semiconductor component of claim 12 wherein the interconnect contacts have planar surfaces.

14. The semiconductor component of claim 12 further comprising an encapsulant on the base die at least partially encapsulating the interconnect contacts, with the encapsulant and the back side forming a planar surface for the conductors, the pads and the terminal contacts.

15. The semiconductor component of claim 12 wherein the base die has a first peripheral outline, the secondary die has a second peripheral outline, and the interconnect contacts are in an area between the first peripheral outline and the second peripheral outline.

16. The semiconductor component of claim 12 further comprising a second secondary die stacked and bonded to the secondary die.

17. The semiconductor component of claim 12 wherein the interconnect contacts comprise planarized bumps or balls.

18. A semiconductor component comprising:
a first die having a first peripheral outline and comprising a plurality of integrated circuits, a plurality first contacts in electrical communication with the integrated circuits, and a plurality of second contacts in electrical communication with the first contacts having a pattern;
a thinned second die on the first die flip chip bonded to the first contacts having a second peripheral outline smaller than the first peripheral outline and a thinned backside;
an encapsulant on the second die in an area bounded by the first peripheral outline and the second peripheral outline, encapsulating the second contacts;
the second contacts, the encapsulant and the thinned backside forming a planar surface;
a redistribution layer on the planar surface comprising a plurality of conductors and pads in an area array on the thinned backside of the second die and on the encapsulant in electrical communication with the second contacts, the conductors configured to redistribute the pads from the pattern of the second contacts to the area array; and
a plurality of terminal contacts for the component on the pads.

19. The semiconductor component of claim 18 wherein an outside surface of the encapsulant and the thinned back side of the second die form a planar surface for the pads and the terminal contacts.

20. The semiconductor component of claim 18 wherein the second contacts comprise bumps or balls having planar surfaces.

21. The semiconductor component of claim 18 wherein the terminal contacts comprise balls or bumps in a ball grid array or a fine ball grid array.

22. The semiconductor component of claim 18 further comprising at least one surface mounted electrical device on the first die in electrical communication with the terminal contacts.

23. The semiconductor component of claim 18 wherein the second die comprises a plurality of pin contacts bonded to the first contacts.

24. The semiconductor component of claim 18 wherein the second contacts comprise bumps or balls having planar surfaces.

25. The semiconductor component of claim 18 wherein the first peripheral outline is substantially identical to a footprint of the semiconductor component.

26. The semiconductor component of claim 18 further comprising a plurality of conductors on the first die in electrical communication with the first contacts and the second contacts.

27. The semiconductor component of claim 18 wherein the semiconductor component comprises a package or a module.

28. The semiconductor component of claim 18 wherein the encapsulant comprises a curable polymer.

29. The semiconductor component of claim 18 wherein the encapsulant comprises a laser imageable polymer.

30. The semiconductor component of claim 18 wherein the encapsulant comprises a molded underfill material.

31. A semiconductor component comprising:
a base die comprising a plurality of integrated circuits, a plurality of first contacts in electrical communication with the integrated circuits, and a plurality of second contacts in electrical communication with the first contacts in a pattern;
a thinned secondary die on the base die comprising a circuit side, a thinned back side, and a plurality of bumped contacts on the circuit side bonded to the first contacts;
a plurality of conductors on the thinned back side in electrical communication with the second contacts configured to redistribute the pattern of the second contacts to an area array;
a plurality of pads on the thinned back side in the area array in electrical communication with the conductors; and
at least one surface mounted electrical element on the base die in electrical communication with a pad; and
a plurality of terminal contacts on the pads in the area array.

32. The semiconductor component of claim 31 wherein the terminal contacts comprise balls in a ball grid array or a fine ball grid array.

33. The semiconductor component of claim 31 further comprising an encapsulant encapsulating the second contacts and edges of the secondary die.

34. The semiconductor component of claim 31 wherein the surface mounted electrical element comprises a capacitor.

35. The semiconductor component of claim 31 wherein the second contacts comprise bumps or balls.

36. The semiconductor component of claim 31 wherein the area array comprise a ball grid array or a fine ball grid array.

37. The semiconductor component of claim 31 wherein the base die comprises an application specific device and the secondary die comprises a memory device.

38. The semiconductor component of claim 31 further comprising an encapsulant on the base die encapsulating the second contacts, with the encapsulant, the second contacts and the thinned back side having a planar surface for the conductors and the pads.

* * * * *

UNITED STATES PATENT AND TRADEMARK OFFICE
CERTIFICATE OF CORRECTION

PATENT NO. : 7,388,294 B2  Page 1 of 1
APPLICATION NO. : 10/351888
DATED : June 17, 2008
INVENTOR(S) : Klein et al.

It is certified that error appears in the above-identified patent and that said Letters Patent is hereby corrected as shown below:

In column 15, line 28, in Claim 18, after "plurality" insert -- of --.

Signed and Sealed this

Thirtieth Day of September, 2008

JON W. DUDAS
*Director of the United States Patent and Trademark Office*